United States Patent
Yi et al.

(10) Patent No.: US 10,825,522 B2
(45) Date of Patent: Nov. 3, 2020

(54) METHOD FOR FABRICATING LOW AND HIGH/MEDIUM VOLTAGE TRANSISTORS ON SUBSTRATE

(71) Applicant: UNITED MICROELECTRONICS CORP., Hsinchu (TW)

(72) Inventors: Liang Yi, Singapore (SG); Zhaobing Li, Singapore (SG); Chi Ren, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/173,406

(22) Filed: Oct. 29, 2018

(65) Prior Publication Data
US 2020/0135274 A1 Apr. 30, 2020

(51) Int. Cl.
*G11C 16/04* (2006.01)
*H01L 45/00* (2006.01)
*G11C 13/00* (2006.01)
*H01L 27/11517* (2017.01)

(52) U.S. Cl.
CPC ...... *G11C 16/0441* (2013.01); *G11C 13/0007* (2013.01); *H01L 27/11517* (2013.01); *H01L 45/145* (2013.01)

(58) Field of Classification Search
CPC ............ G11C 16/0441; G11C 13/0007; H01L 27/11517; H01L 45/145
See application file for complete search history.

(56) References Cited

U.S. PATENT DOCUMENTS

| | | | |
|---|---|---|---|
| 6,087,211 A | 7/2000 | Kalnitsky et al. | |
| 6,251,728 B1 | 6/2001 | Patelmo et al. | |
| 7,973,344 B2* | 7/2011 | Banna | H01L 27/098 257/256 |
| 2005/0199956 A1* | 9/2005 | Ding | H01L 27/115 257/365 |
| 2008/0067599 A1* | 3/2008 | Tsutsumi | H01L 21/82381 257/358 |
| 2009/0269893 A1* | 10/2009 | Hashimoto | H01L 27/105 438/264 |
| 2016/0336337 A1* | 11/2016 | Lin | H01L 27/11563 |

* cited by examiner

*Primary Examiner* — Jerome Leboeuf
(74) *Attorney, Agent, or Firm* — J.C. Patents (57) ABSTRACT

A structure of nonvolatile memory device includes a substrate, having a logic device region and a memory cell region. A first gate structure for a low-voltage transistor is disposed over the substrate in the logic device region, wherein the first gate structure comprises a single-layer polysilicon. A second gate structure for a memory cell is disposed over the substrate in the memory cell region. The second gate structure includes a gate insulating layer on the substrate. A floating gate layer is disposed on the gate insulating layer, wherein the floating gate layer comprises a first polysilicon layer and a second polysilicon layer as a stacked structure. A memory dielectric layer is disposed on the floating gate layer. A control gate layer is disposed on the memory dielectric layer, wherein the control gate layer and the single-layer polysilicon are originated from a preliminary polysilicon layer in same.

7 Claims, 9 Drawing Sheets

METHOD FOR FABRICATING LOW AND HIGH/MEDIUM VOLTAGE TRANSISTORS ON SUBSTRATE

BACKGROUND

1. Field of the Invention

The present invention generally relates to semiconductor fabrication technology, and particularly to the non-volatile memory device and method for fabricating the non-volatile memory device.

2. Description of Related Art

Memory device includes a large number of memory cells, which are arranged into a manner of cell array. The memory cells are accessed by the peripheral circuit so to further communicate with the external electronic apparatus. The peripheral circuit usually includes low-voltage (LV) metal-oxide-semiconductor (MOS) devices, which are operated at the usual LV range as usually known in the art. The peripheral circuit and the memory cells are usually integrated together as a whole device.

For the further development, the peripheral circuit is no longer to be just operated in the LV range, so the medium-voltage (MV) MOS device or high-voltage (HV) MOS device may also be included in the peripheral circuit. Generally, the peripheral circuit is not just limited to the LV MOS devices, and may additionally include the MV/HV MOS device. The peripheral circuit is also not just limited to the control circuit to access the memory cells. The peripheral circuit may be a core logic circuit in general operation, in which the data as to be accessed by the peripheral circuit are stored in the memory cells.

In fabrication, the transistors of the peripheral circuit and the memory cells at the memory region are fabricated over the same substrate. The fabrication processes would be performed for forming the transistors of peripheral circuit and/or the memory cells. In other words, the LV device may be affected by the processes for processing the memory cells, and then finally get failure.

As to the fabrication of non-volatile memory device including memory cells and the MOS device, it needs to be actually considered that the quality of the logic MOS devices, such as LV MOS devices, is not affected by the fabrication process for the memory cell.

SUMMARY OF THE INVENTION

The invention provides a structure of non-volatile memory device and the fabrication method thereof, capable of at least reducing the effect on MOS device while the gate structures of the memory cells are fabricated. The performance of the MOS device can maintain with less possibility in getting failure later due to the high temperature fabrication process.

In an embodiment, the invention provides a structure of nonvolatile memory device including a substrate, having a logic device region and a memory cell region. A first gate structure for a low-voltage transistor is disposed over the substrate in the logic device region, wherein the first gate structure comprises a single-layer polysilicon. A second gate structure for a memory cell is disposed over the substrate in the memory cell region. The second gate structure includes a gate insulating layer on the substrate. A floating gate layer is disposed on the gate insulating layer, wherein the floating gate layer comprises a first polysilicon layer and a second polysilicon layer as a stacked structure. A memory dielectric layer is disposed on the floating gate layer. A control gate layer is disposed on the memory dielectric layer, wherein the control gate layer and the single-layer polysilicon are originated from a preliminary polysilicon layer in same.

In an embodiment, as to the structure of nonvolatile memory, a thickness of the control gate layer is substantially equal to a thickness of the single-layer polysilicon for the first gate structure.

In an embodiment, as to the structure of nonvolatile memory, the memory dielectric layer comprises an oxide/nitride/oxide (ONO) structure.

In an embodiment, as to the structure of nonvolatile memory, the second polysilicon layer is thicker than the first polysilicon layer.

In an embodiment, as to the structure of nonvolatile memory, it further includes shallow trench isolation structures to isolate the first gate structure and the second gate structure, wherein the shallow trench isolation structures include a lower portion in the substrate.

In an embodiment, as to the structure of nonvolatile memory, the first polysilicon layer is lower in height than the shallow trench isolation structures.

In an embodiment, as to the structure of nonvolatile memory, it further includes a third gate structure for a medium-voltage device or a high-voltage device over the substrate in the logic device region.

In an embodiment, as to the structure of nonvolatile memory, the third gate structure has the stacked structure of the floating gate structure.

In an embodiment, as to the structure of nonvolatile memory, it further includes a gate insulating layer between the single-layer polysilicon and the substrate at the logic device region.

In an embodiment, the invention further provides a method for fabricating nonvolatile memory device, including providing a substrate, having a logic device region and a memory cell region. A first gate structure for a low-voltage transistor is formed over the substrate in the logic device region, wherein the first gate structure comprises a single-layer polysilicon. A second gate structure for a memory cell is formed over the substrate in the memory cell region. The second gate structure is formed, including forming a gate insulating layer on the substrate and forming a floating gate layer on the gate insulating layer just at the memory cell region. The floating gate layer is formed by forming a first polysilicon layer and a second polysilicon layer as a stacked structure. Further, a memory dielectric layer is formed on the floating gate layer just at the memory cell region. A control gate layer is formed on the memory dielectric layer at a same time as forming the single-layer polysilicon in the logic device region.

In an embodiment, as to the method for fabricating nonvolatile memory device, a thickness of the control gate layer is substantially equal to a thickness of the single-layer polysilicon for the first gate structure.

In an embodiment, as to the method for fabricating nonvolatile memory device, the memory dielectric layer is formed by forming an oxide/nitride/oxide (ONO) layer.

In an embodiment, as to the method for fabricating nonvolatile memory device, the second polysilicon layer is thicker than the first polysilicon layer.

In an embodiment, as to the method for fabricating nonvolatile memory device, it further includes forming shallow trench isolation structures with a lower portion in the substrate to isolate the first gate structure and the second gate structure.

In an embodiment, as to the method for fabricating nonvolatile memory device, the first polysilicon layer is lower in height than the shallow trench isolation structures.

In an embodiment, as to the method for fabricating nonvolatile memory device, it further includes forming a third gate structure for a medium-voltage device or a high-voltage device over the substrate in the logic device region.

In an embodiment, as to the method for fabricating nonvolatile memory device, the third gate structure has the stacked structure of the floating gate structure.

In an embodiment, as to the method for fabricating nonvolatile memory device, it further includes forming a gate insulating layer between the single-layer polysilicon and the substrate at the logic device region.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to fabrication of memory device, which includes memory cell and LV logic device and may also the logic high-voltage (HV)/medium-voltage (MV) device.

Several embodiments are provided for describing the invention. However, the invention is not just limited to the embodiments as provided. Further, another embodiment may also be possibly made by combining the embodiments as provided.

Figure 1:
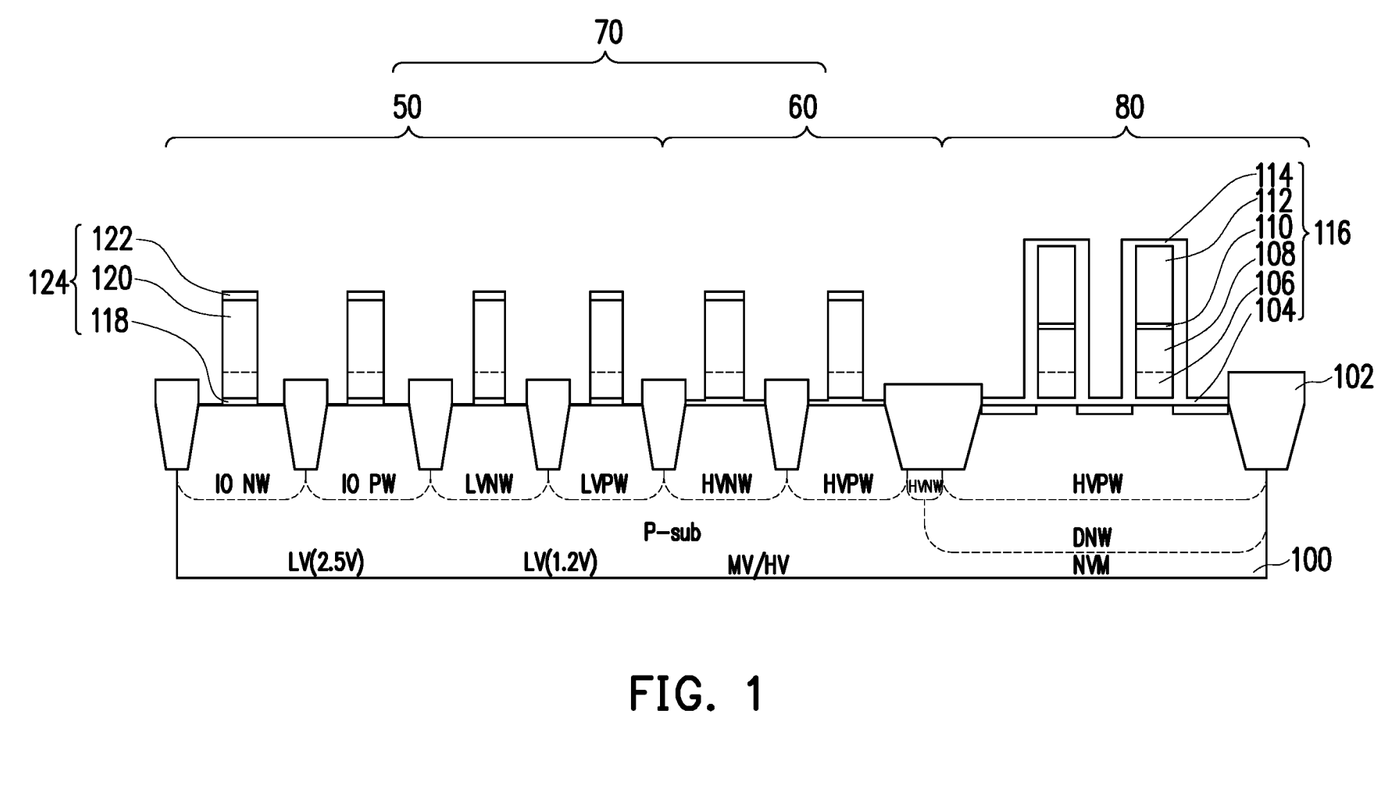
FIG. 1 is a drawing, schematically illustrating a structure of non-volatile memory device as looked into, according to an embodiment of the invention.

FIG. 1 is a drawing, schematically illustrating a structure of non-volatile memory device as looked into, according to an embodiment of the invention. Referring to FIG. 1, according to the development in fabrication the non-volatile memory device, a self-aligned shallow trench isolation (SASTI) is involved, and multiple layers of polysilicon for the gate of the logic devices are involved. After looking into the structure of non-volatile memory device in FIG. 1, some issues have at least been found as described below.

The non-volatile memory device includes a substrate 100, having a logic device region 70 and a memory cell region (non-volatile memory, NVM) 80. Non-volatile memory cells are formed at the memory cell region 80 and the logic devices of the peripheral circuit are formed at the logic device region. Due to the multiple-function operation, the logic device region 70 includes the LV device region 50 and the MV/HV device region 60. The LV devices, such as LV transistor, are operated between 2.5 V and 1.2 V according actual operation in an example, in which the input/output (IO) logic device may be operated at the voltage level of 2.5V. The logic devices include the field effect transistor (FET). However, the LV range and the MV/HV range are usually known in the art without describing in detail.

The SASTI structures 102 are formed in the substrate with a protruding portion from the substrate 100. Various doped wells with the conductive type of N-type or P-type are formed in the substrate 100. Various doped wells in an example include IO N-type well (NW), IO P-type well (PW), LV NW (LVNW), LV PW (LVPW), HV NW (HVNW), HV PW (HVPW), deep NW (DNW), and so on, but not the limitation. The LV logic gates 124 are forming in the LV device region 50 and the MV/HV device region 60. The memory gate structures 116 are in the memory cell region 80.

Usually in an embodiment, the memory gate structures 116 for the non-volatile memory cell includes a memory gate structure 116. The memory gate structure 116 includes an insulating layer 104 on the substrate 100. Then, a floating gate in double-layer structure including a polysilicon layer 106 and a polysilicon layer 108 is disposed on the gate insulating layer 104. A memory dielectric layer 110, such as oxide/nitride/oxide (ONO) structure, is disposed on the polysilicon layer 108 of the floating gate. A control gate 112 of polysilicon layer is disposed on the memory dielectric layer 110. In addition, a mask layer 114 may be formed to cover the sidewall and the top of the memory gate structure 116. Further, an additional doped region 106 may be formed in the substrate 100.

As noted, the floating gate for the memory gate structure 116 includes the first polysilicon layer 106 and the second polysilicon layer 108. The control gate 112 may be called as the third polysilicon layer. Due to fabrication procedure, in an embodiment, the same procedure for forming the floating gate involving the first polysilicon layer 106 and the second polysilicon layer 108 may be commonly applied to logic device region 70 to form the usual logic gate structure 124, which includes the gate insulating layer 118 and the gate layer 120 and the mask layer 122. The gate layer 120 for the logic device is formed by the same stack for the floating gate with the first polysilicon layer 106 and the second polysilicon layer 108.

The invention has looked into the non-volatile memory device in FIG. 1 above, and found at least an issue that the gate for the LV field effect transistor (FET) involving two polysilicon layers, in which the first polysilicon layer 106 is first formed between SASTI structures 102. In this stage to form the SASTI structures 102, a high temperature annealing process to is performed to form the STI. The first polysilicon layer 106 suffers the high temperature annealing process and the grain size of the first polysilicon layer 106 gets larger. This large grain size of the polysilicon layer 106 in the gate layer 120 would reduce the dopant diffusing capability in later procedure. At the end, it has been found that the performance for the LV device may get worse or even get failure.

After looking into the structure of non-volatile memory device in an embodiment as shown in FIG. 1, the invention has further proposed a modification in fabrication, resulting in different structure.

FIG. 2A to FIG. 2H are drawings, schematically illustrating a method for fabricating non-volatile memory device, according to an embodiment of the invention.

Figure 2A:
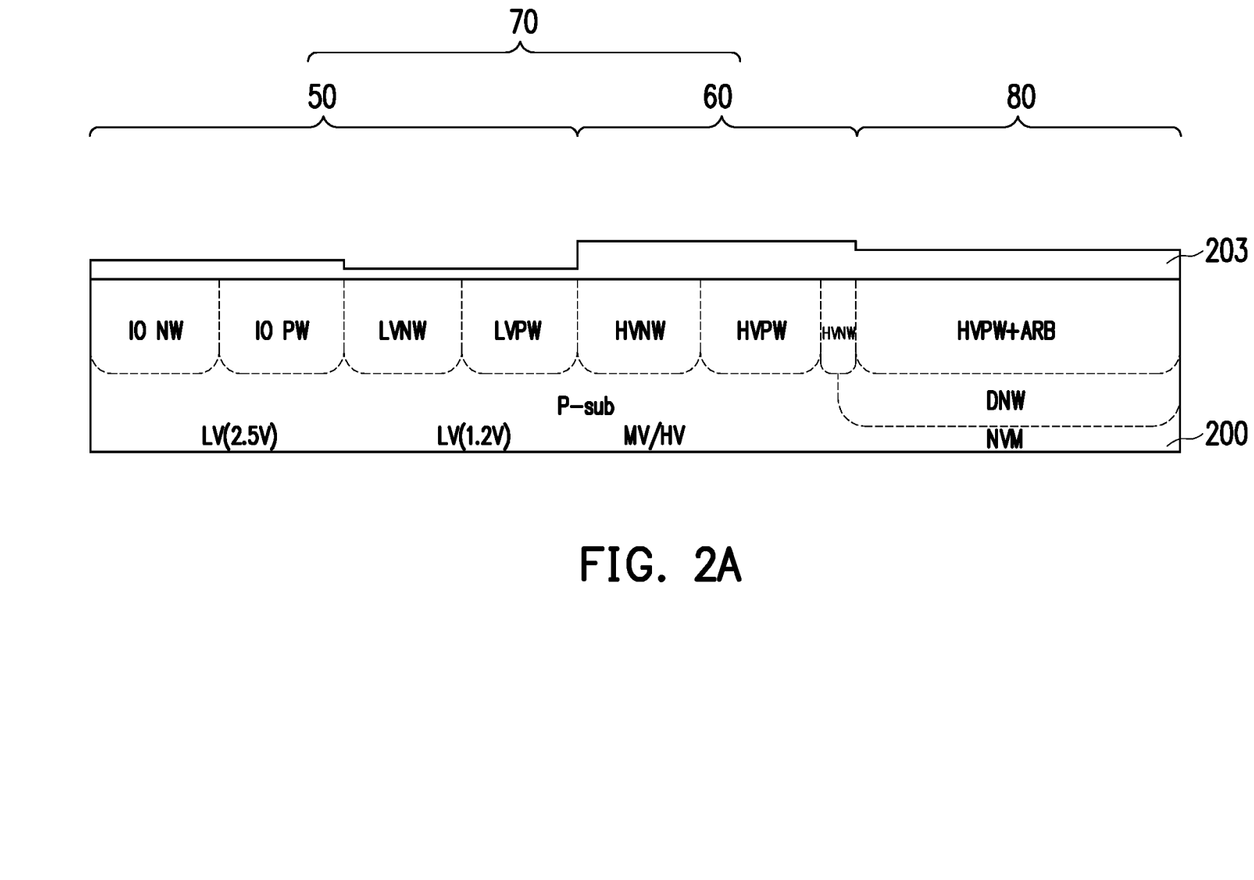
FIG. 2A to FIG. 2H are drawings, schematically illustrating a method for fabricating non-volatile memory device, according to an embodiment of the invention.

Referring to FIG. 2A, a substrate is provided in which the substrate has been configured to have the logic device 70 and the memory cell region 80 as described in FIG. 1. In addition, various doped regions are correspondingly formed in the substrate 100. A gate insulating layer 202 is formed on a substrate 200. Due to the different operation for logic transistors and the memory device, the thicknesses of the gate insulating layer 203 for different regions are different.

In later descriptions, the thickness for the gate insulating layer 203 is not shown in detail and then is indicated by the gate insulating layer 204 with a uniform thickness. The invention is not specifically limited to the thickness for the gate insulating layer 203/204.

Figure 2B:
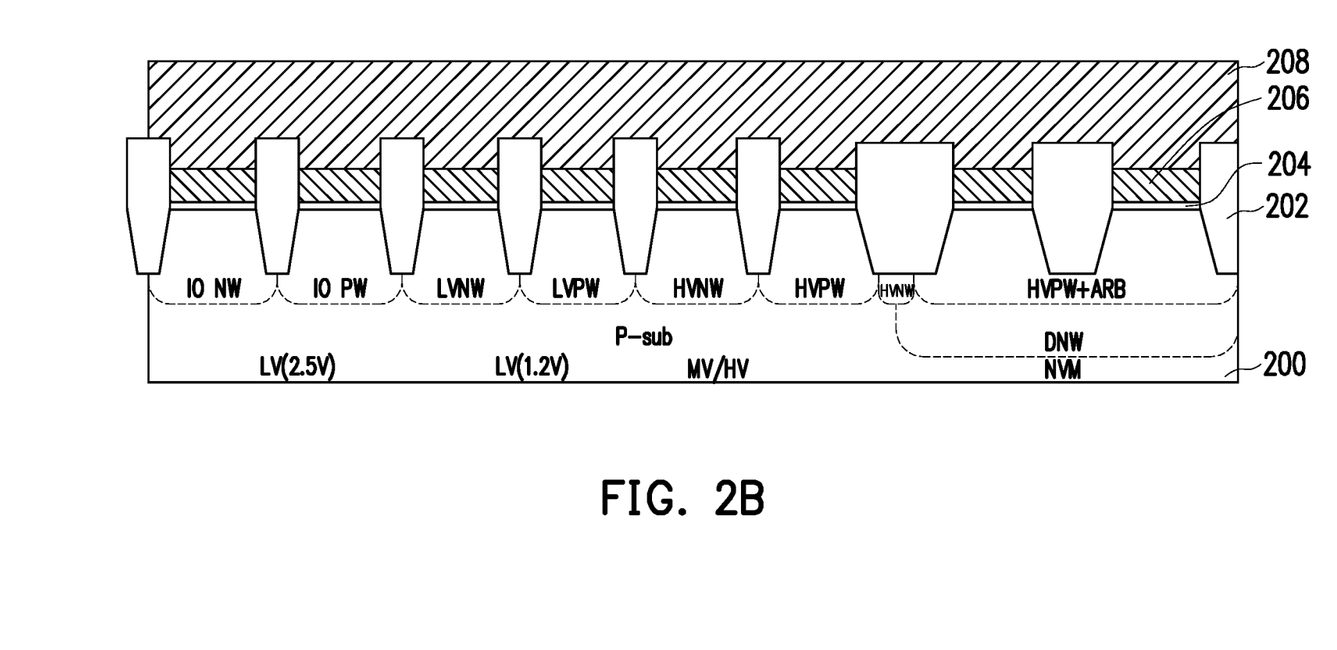

Referring to FIG. 2B, multiple SASTI structures 202 are formed in the substrate 200 based on the SASTI fabrication processes in an example, in which a portion of the SASTI structures is protruding from the substrate 200. After fabrication in forming the SASTI structures 202, a first polysilicon layer 206 is between the SASTI structures 202. Then, a second polysilicon layer 208 is deposited over the substrate 200, in which a portion of the second polysilicon layer 208 is staked on the first polysilicon layer 206. The second polysilicon layer 208 in an embodiment is thicker than the first polysilicon layer 206. In an example, the first polysilicon layer 206 has a thickness of 400 Angstroms and the second polysilicon layer has a thickness of 600 Angstroms.

Figure 2C:
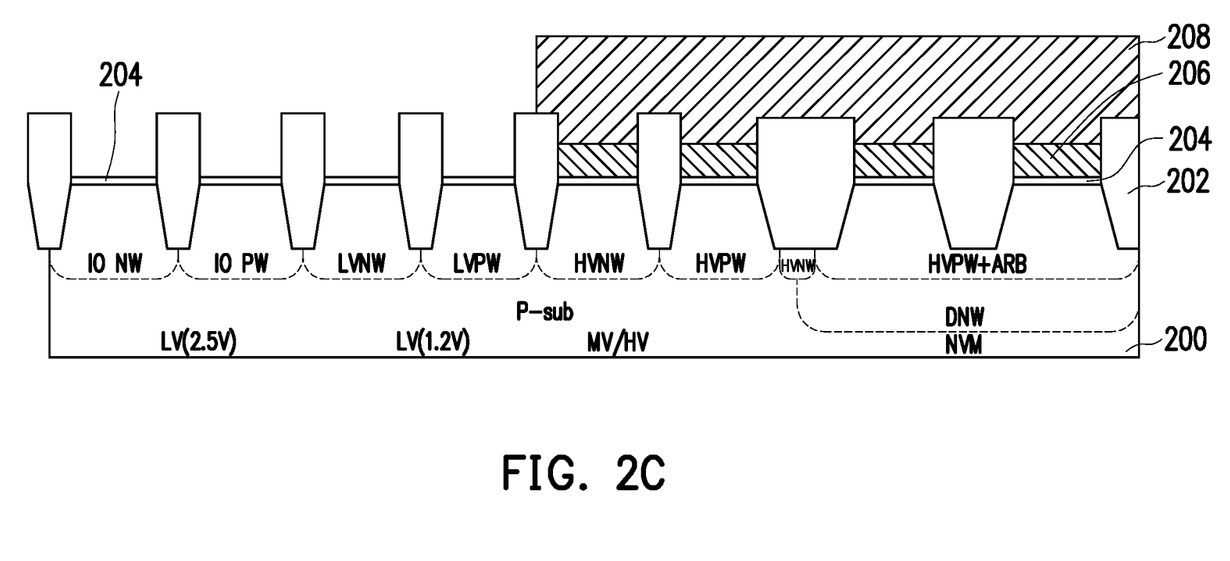

Referring to FIG. 2C, the first polysilicon layer 206 and the second polysilicon layer 208 are patterned to remove a portion of the first polysilicon layer 206 and the second polysilicon layer 208 at the LV device region 50, so to expose the gate insulating layer 204 for the LV logic device.

Figure 2D:
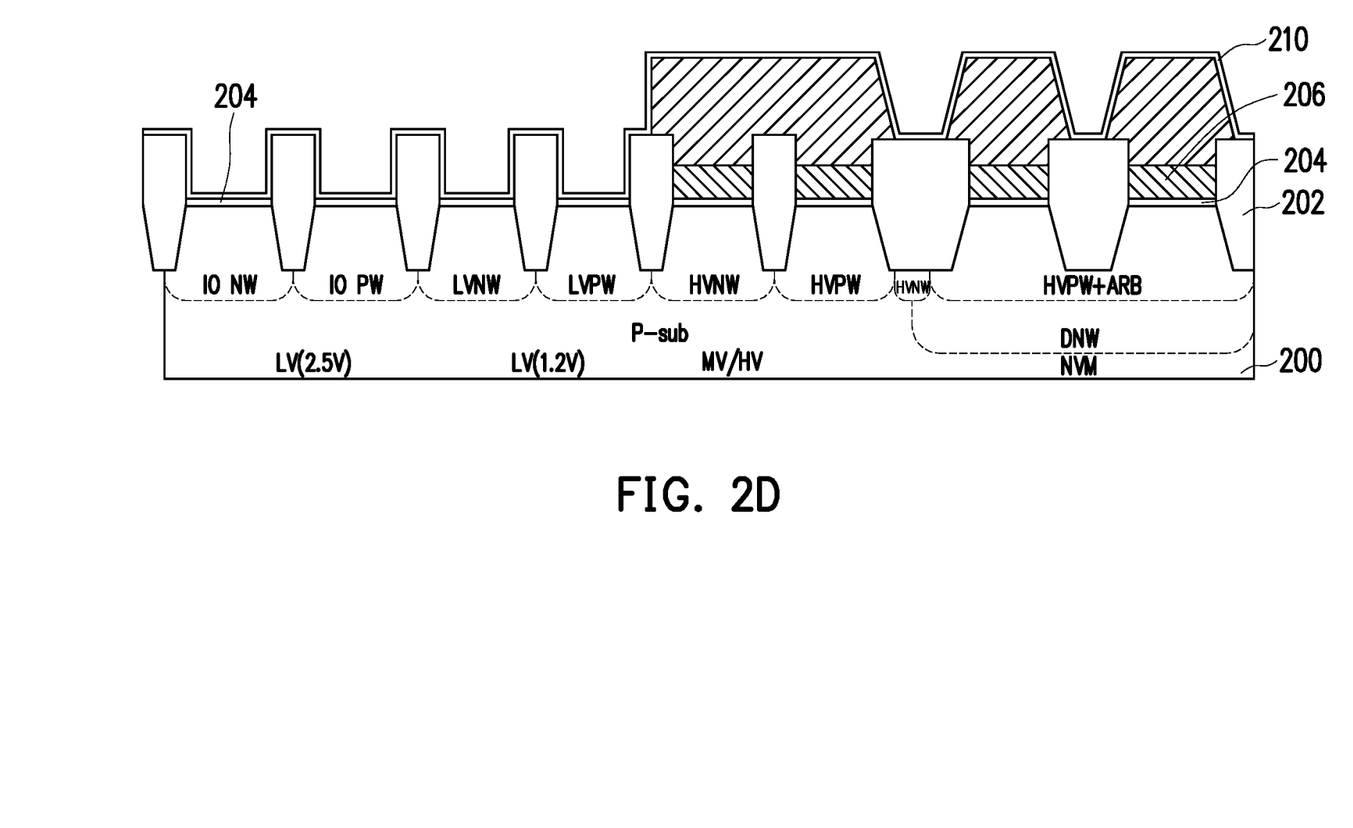

Referring to FIG. 2D, the second polysilicon layer 208 is further patterned to exposed the selected SASTI structure 202 at the memory cell region 80. Then, a memory dielectric layer 210 is conformally formed over the substrate. The memory dielectric layer 210 is for storing charges, so to perform the memory capability in operation. In an example, the memory dielectric layer 210 may be an ONO structure as usually known in the art. The invention is not specifically limited to the memory dielectric layer 210 as an example.

Figure 2E:
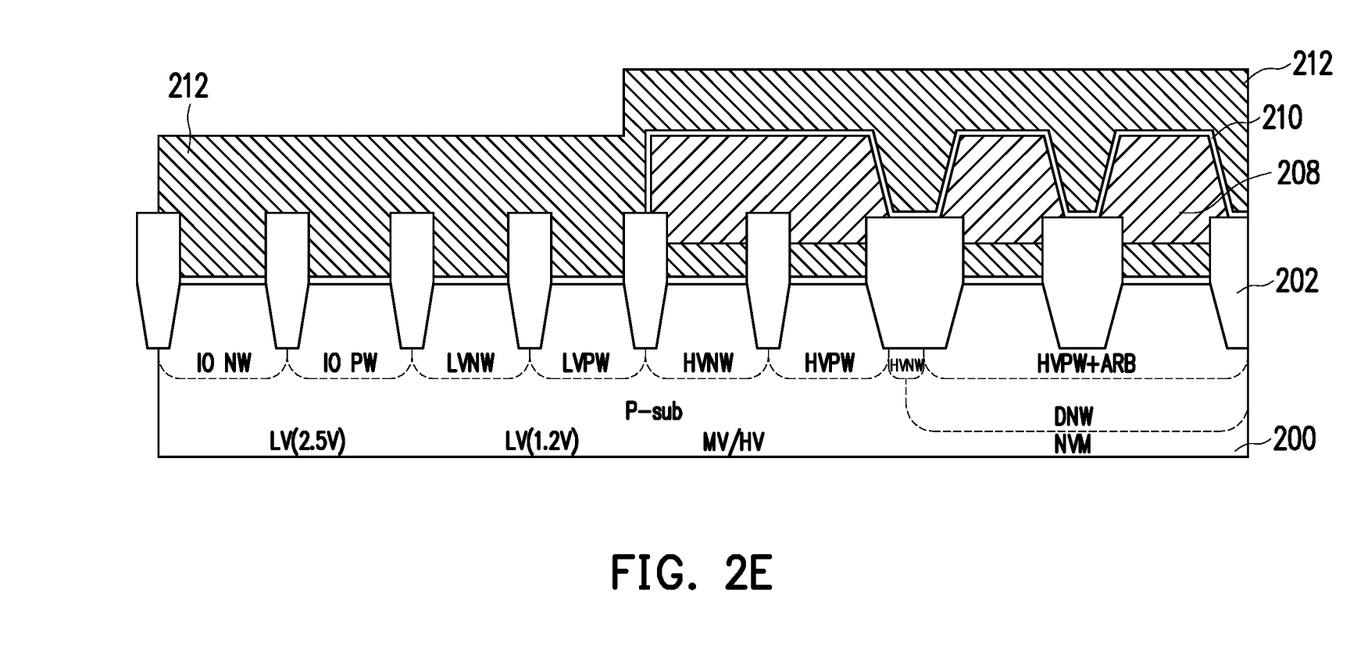

Referring to FIG. 2E, the memory dielectric layer 210 is patterned to remove a portion over the LV device region 50. A third polysilicon layer 212 is deposited over the substrate 200. The thickness of the third polysilicon layer 212, in a further example, is about 1000 Angstroms or about equal to the sum of the first polysilicon layer 206 and the second polysilicon layer 208. As a result, a portion of the third polysilicon layer 212 is on the gate insulating layer 202 in the LV device region 50 and a portion of the third polysilicon layer 212 is on the memory dielectric layer 210 in the memory cell region 80. In the current stage, the MV/HV device region 60 may have the same stack structure as the stack structure in the memory cell region 80.

Figure 2F:
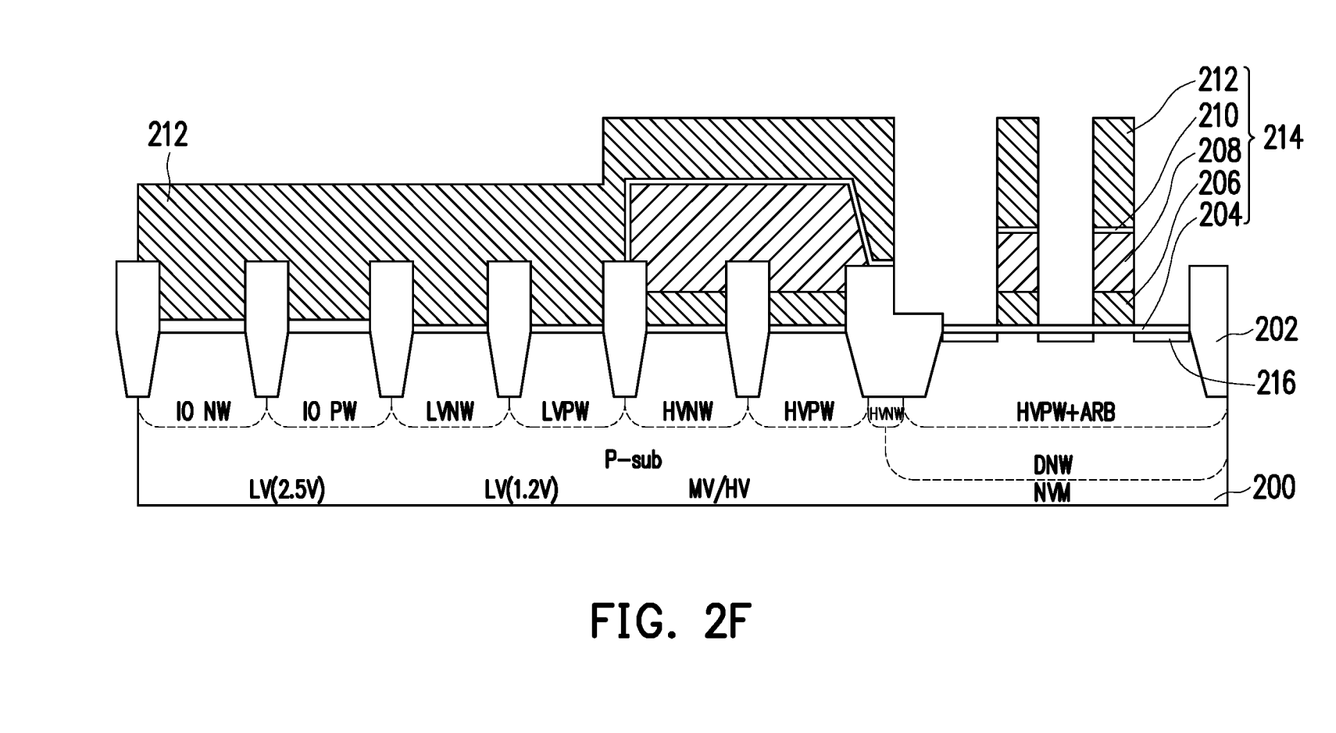

Referring to FIG. 2F, by the proper mask layer covering over the logic device region 70, a portion in the logic device region 70 of the third polysilicon layer 212, the memory dielectric layer 210, the second polysilicon layer 208, and the first polysilicon layer 206 are patterned to form the memory gate structures 214. It can be noted that the cross-section structure in FIG. 2F is in a cutting direction, such as the Y direction, on the cell array is different from the cutting direction, such as the X direction, in FIG. 2E. In this cutting direction of FIG. 2F, the SASTI between the memory gate structures 214 is not seen. In addition, a further doping process can be performed to additionally form the doped region 216 in the substrate 200 between the memory gate structures 214.

In the memory gate structures 214, the first polysilicon layer 206 and the second polysilicon layer 208 are stacked to serve as the floating gate of the memory cell. The third polysilicon layer 212 is serving as the control gate. The floating gate and the control gate are separated by the memory dielectric layer 210.

Figure 2G:
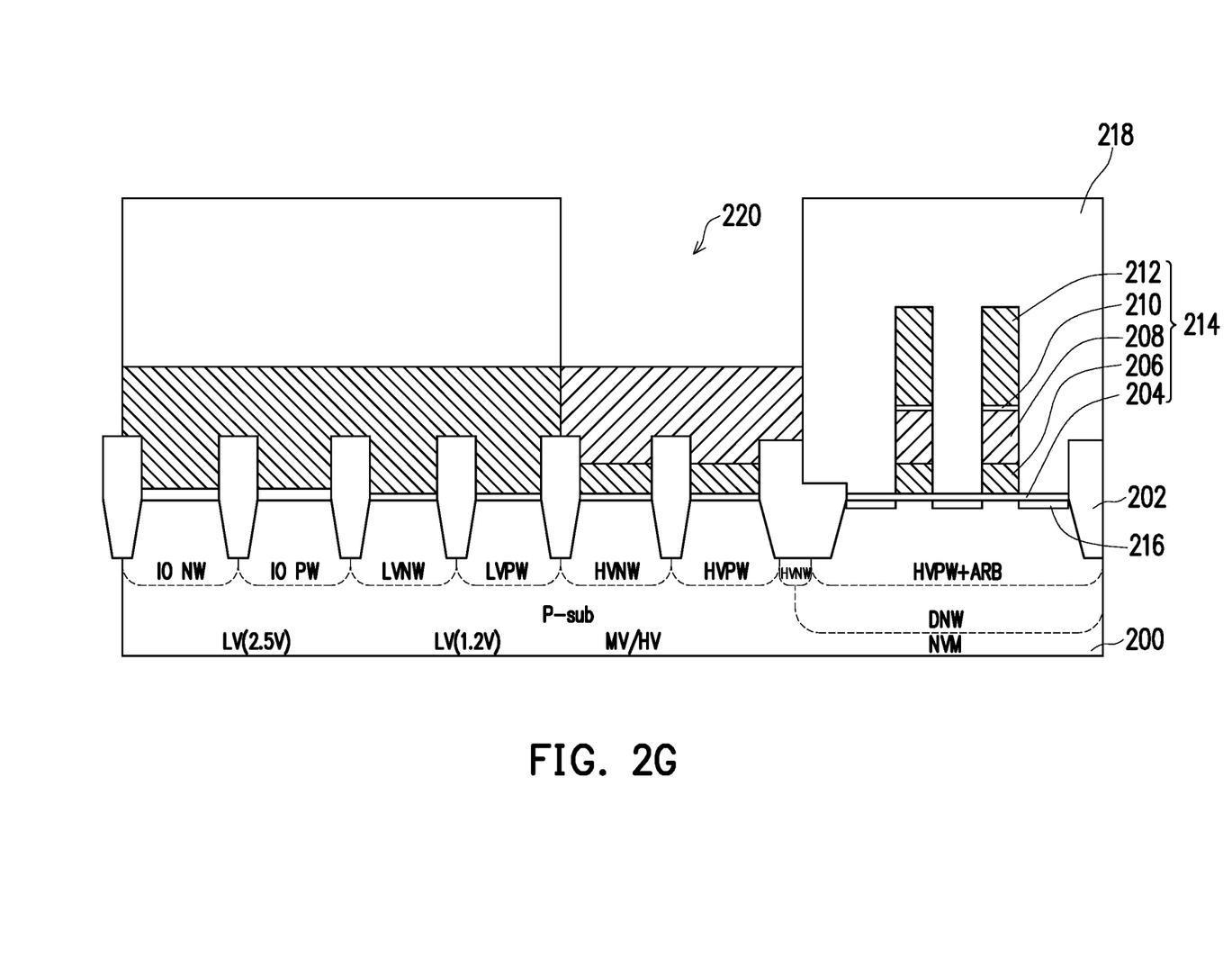

Referring to FIG. 2G, a photoresist layer 218 with an opening 220 to expose MV/HV device region 60. Then, the third polysilicon layer 212 can be removed by etching, so to expose the second polysilicon layer 212. In an embodiment, the height of the second polysilicon layer 208 in an example may be about the same as the third polysilicon layer 212.

Figure 2H:
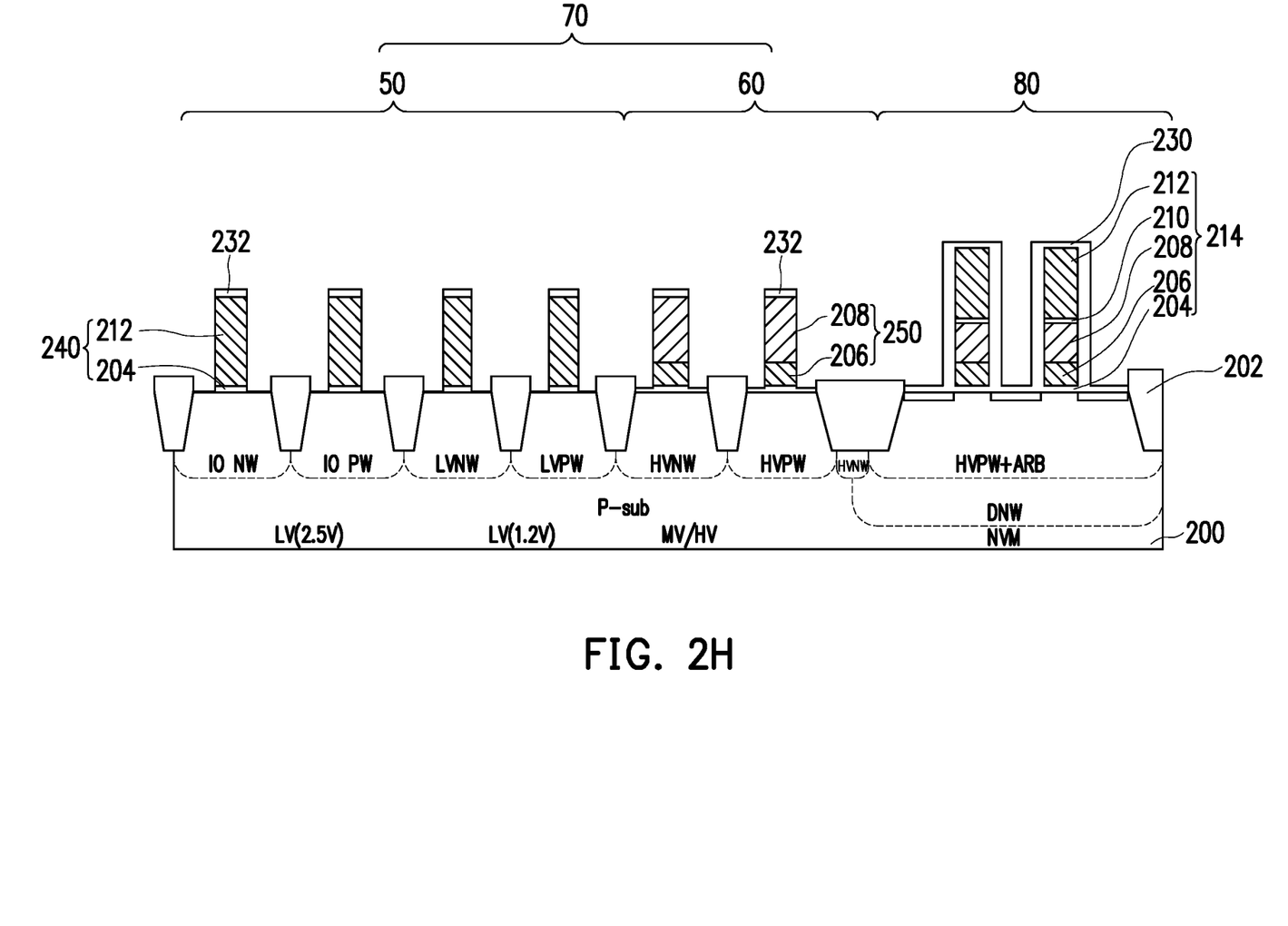

Referring to FIG. 2H, after the subsequent process in several steps, the gate structures 240 for the LV logic device, the gate structures 250 for MV/HV logic device and the gate structure 214 for the memory cells are formed over the substrate 200. The mask layer 232 on the gate structures 240, 250 in the logic device region 80 may be additionally formed. Likewise, the mask layer 230 is also formed to cover the gate structures 214 for isolation. However, the invention is not specifically limited to the mask layer, which can be modified in accordance with the actual need.

The gate structures of the non-volatile memory device for the logic MOS FET and memory cells has been formed as shown in FIG. 2H. The subsequent fabrication process may be performed to actually accomplish the memory device. However, the invention provides the gate structures in accordance with the fabrication process can at least reduce the failure of the gate structure in performance.

The invention has proposed the fabrication process for the non-volatile memory device, resulting in a structure that the gate for the LV device is a single-layer, and the floating gate (FG) for the memory cell is formed by first polysilicon layer and the second polysilicon layer and the control gate (CG) is formed from the third polysilicon layer. The gate for the LV device is single layer and the dopant can be more fully diffused into the whole gate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A method for fabricating nonvolatile memory device, comprising:
    providing a substrate, having a logic device region and a memory cell region;
    forming a first gate structure for a low-voltage transistor, disposed over the substrate in the logic device region, wherein the first gate structure comprises a single-layer polysilicon; and
    forming a second gate structure for a memory cell, disposed over the substrate in the memory cell region and a third gate structure for a medium-voltage device or a high-voltage device over the substrate in the logic device region, wherein the second gate structure is formed, comprising:
    forming a gate insulating layer on the substrate;
    forming a floating gate layer on the gate insulating layer just at the memory cell region, wherein the floating gate layer is formed by forming a first polysilicon layer and a second polysilicon layer as a stacked structure, wherein a gate stack of the third gate structure in the logic device region is also formed with the stack structure being same as that of the floating gate layer;
    forming a memory dielectric layer on the floating gate layer just at the memory cell region; and
    forming a control gate layer on the memory dielectric layer at a same time as forming the single-layer polysilicon in the logic device region, wherein the control gate layer is disposed directly above the floating gate layer.

2. The method for fabricating nonvolatile memory device of claim 1, wherein a thickness of the control gate layer is substantially equal to a thickness of the single-layer polysilicon for the first gate structure.

3. The method for fabricating nonvolatile memory device of claim 1, wherein the memory dielectric layer is formed by forming an oxide/nitride/oxide (ONO) layer.

4. The method for fabricating nonvolatile memory device of claim 1, wherein the second polysilicon layer is thicker than the first polysilicon layer.

5. The method for fabricating nonvolatile memory device of claim 4, further comprising forming shallow trench isolation structures with a lower portion in the substrate to isolate the first gate structure and the second gate structure.

6. The method for fabricating nonvolatile memory device of claim 5, wherein the first polysilicon layer is lower in height than the shallow trench isolation structures.

7. The method for fabricating nonvolatile memory device of claim 1, further comprising forming a gate insulating layer of the first gate structure for the low-voltage transistor between the single-layer polysilicon and the substrate at the logic device region.

\* \* \* \* \*